(12) United States Patent
Chang et al.

(10) Patent No.: US 9,063,193 B2
(45) Date of Patent: Jun. 23, 2015

(54) LAYOUT STRUCTURE OF ELECTRONIC ELEMENT AND TESTING METHOD OF THE SAME THEREOF

(71) Applicant: UNITED MICROELECTRONICS CORP., Hsinchu (TW)

(72) Inventors: Chun-Ming Chang, Kaohsiung (TW); Chun-Liang Hou, Hsinchu County (TW); Wen-Jung Liao, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 318 days.

(21) Appl. No.: 13/744,498

(22) Filed: Jan. 18, 2013

(65) Prior Publication Data

US 2014/0203828 A1 Jul. 24, 2014

(51) Int. Cl.
*G01R 1/073* (2006.01)
*H01L 21/00* (2006.01)
*G01R 31/26* (2014.01)
*H01L 21/66* (2006.01)

(52) U.S. Cl.
CPC ..... *G01R 31/2601* (2013.01); *H01L 2924/0002* (2013.01); *H01L 22/34* (2013.01)

(58) Field of Classification Search
CPC ........................................................ G01R 1/073
USPC ............................. 324/750.02, 750.3, 754.02
See application file for complete search history.

(56) References Cited

U.S. PATENT DOCUMENTS 5,508,631 A * 4/1996 Manku et al. .............. 324/750.3
8,179,155 B2 5/2012 Tseng

* cited by examiner

*Primary Examiner* — Vincent Q Nguyen
(74) *Attorney, Agent, or Firm* — WPAT, PC; Justin King

(57) ABSTRACT

A layout structure of an electronic element including an electronic matrix, a first load and a second load is disclosed. The first load couples to a first end of the electronic matrix and includes a first testing pad and a second testing pad coupling to the first testing pad. The second load couples to a second end of the electronic matrix and includes a third testing pad and a fourth testing pad coupling to the third testing pad.

18 Claims, 3 Drawing Sheets

LAYOUT STRUCTURE OF ELECTRONIC ELEMENT AND TESTING METHOD OF THE SAME THEREOF

BACKGROUND OF THE INVENTION

1. Field of the Invention

The invention relates in general to the invention is related to a layout structure of the electronic element and a method of testing the electronic element, and more particularly to a layout structure of the electronic element having a electronic element matrix, and a method for testing the electronic element matrix

2. Description of the Related Art

During semiconductor manufacturing process, the performance of the element should be evaluated by wafer acceptance test (WAT) after the manufacturing process, in order to confirm the stability of the semiconductor manufacturing process.

The accuracy of the wafer acceptance test will affect the selection of a golden die directly. The golden die should comply with the specification in the semiconductor order form. For example, if an error range of the wafer acceptance test is large, disparity between a selection of the die and the anticipated golden die occurs, thereby affecting the stability of the product. Therefore, a precise result of the wafer acceptance test is important for maintaining the quality and the stability of the wafer to in comply with the requirement of the market.

SUMMARY OF THE INVENTION

The invention is directed to a layout structure of an electronic element and a testing method for testing the electronic element. Two sides of the electronic element matrix to be tested couple to loads, each load comprises two testing pads couple to each other. By calculating the resistance of the loads, current passing through the electronic element matrix can be calculated, and the accuracy of the wafer acceptance test can be improved.

According to a first aspect of the present invention, a layout structure of an electronic element comprising an electronic matrix, a first load and a second load is disclosed. The first load couples to a first end of the electronic matrix and comprises a first testing pad and a second testing pad coupling to the first testing pad. The second load couples to a second end of the electronic matrix and comprises a third testing pad and a fourth testing pad coupling to the third testing pad.

According to a second aspect of the present invention, a method for testing an electronic element is disclosed. The method comprises following steps. A layout structure of an electronic element is provided. The layout structure of the electronic element comprises an electronic element matrix, a first load coupling to a first side of the electronic element matrix and a second load coupling to a second side of the electronic element matrix. The first load comprises a first testing pad and a second testing pad coupling to the first testing pad, the second load comprises a third testing pad and a fourth testing pad coupling to the third testing pad. A first probe is dispose on the first load, and a second probe is dispose on the second load. A first resistor and a second resistor are calculated. The first resistor is a resistor of the first load and a resistor that the first probe contacts the first load, the second resistor is a resistor of the second load and a resistor that the second probe contacts the second load. A voltage difference is applied between the first load and the second load. A current passing through the electronic element matrix is detected. A calibrated current of the electronic element matrix is calculated according to the detected current passing through the electronic element matrix, the voltage difference, the first resistor and the second resistor.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
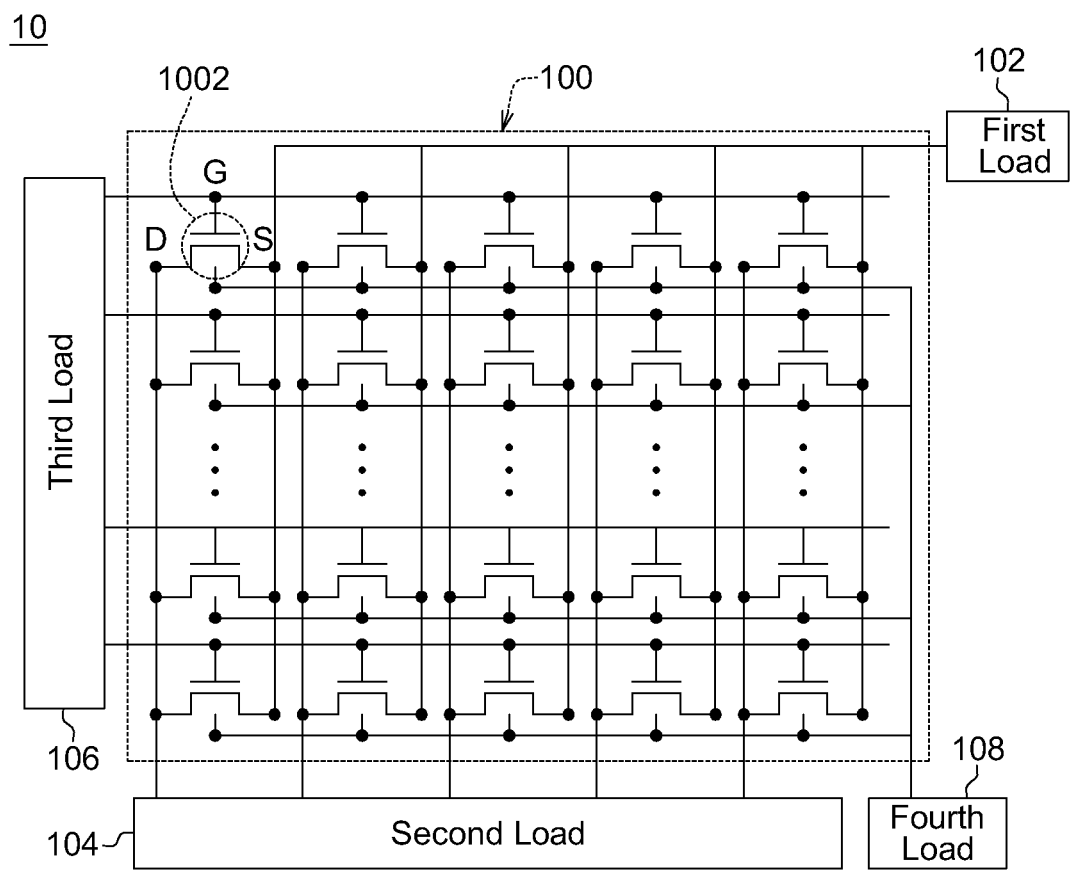
FIG. 1 illustrates a circuit diagram of a layout structure of the electronic element according to an embodiment of the invention.

FIG. 1 illustrates a circuit diagram of a layout structure of an electronic element 10 according to an embodiment of the invention. The layout structure of the electronic element 10 comprises an electronic element matrix 100, a first load 102, a second load 104, a third load 106 and a fourth load 108. The first load 102 couples to a first side of the electronic element matrix 100, a second load 104 couples to a second side of the electronic element matrix 100, a third load 106 couples to a third side of the electronic element matrix 100, a fourth load 108 couples to a fourth side of the electronic element matrix 100.

Please referring to FIG. 1, the electronic element matrix 100 comprises for example a plurality of transistors. In one embodiment, the electronic element matrix 100 can be a Metal-Oxide-Semiconductor Field-Effect Transistor (MOSFET) matrix; the MOSFET matrix can comprise a plurality of MOSFET 1002. The electronic element matrix 100 in FIG. 1 is a MOSFET matrix, and the invention is not limited thereto. In other embodiment, the electronic element matrix 100 can be other types of transistor matrix.

As shown in FIG. 1, the source S of the MOSFET 1002 is connected with each other, to form a common source structure, the common source structure is connected to the first side of the electronic element matrix 100. The drain D of the MOSFET 1002 is connected with each other, to form a common drain structure; the common drain structure is connected to the second side of the electronic element matrix 100. The gate G of the MOSFET 1002 is connected with each other to form a common gate structure; the common gate structure is connected to a third side of the electronic element matrix 100. The body of the MOSFET 1002 is connected with each other to form a common body structure; the common body structure is connected to a fourth side of the electronic element matrix 100.

Figure 2:
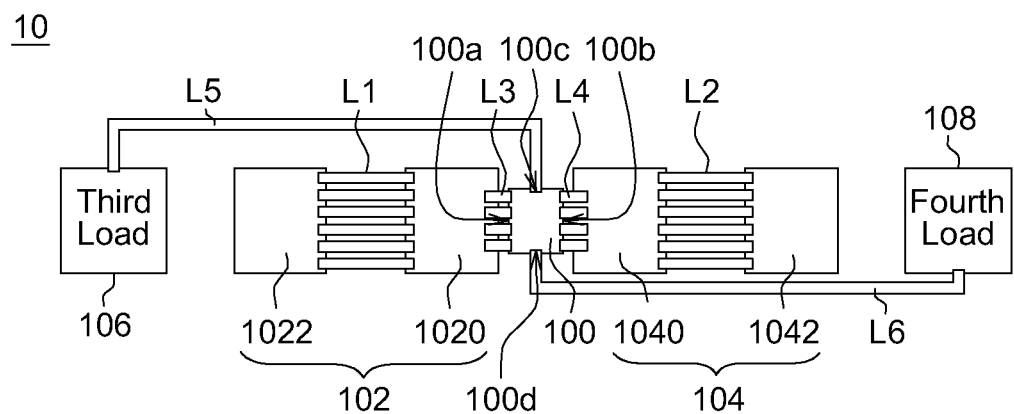
FIG. 2 illustrates a diagram of a layout structure of the electronic element in FIG. 1.

FIG. 2 illustrates a diagram of the layout structure of the electronic element in FIG. 1. The same elements in the layout structure of the electronic element in FIG. 2 and the layout structure of the electronic element in FIG. 1 are represented with same symbols, and are not repeated herein.

As shown in FIG. 2, the first load 102 couples to the first side 100a of the electronic element matrix 100, and the first load 102 comprises a first testing pad 1020 and a second testing pad 1022, the second testing pad 1022 couples to the first testing pad 1020. The second load 104 couples to the second side 100b of the electronic element matrix 100, the second load 104 comprises a third testing pad 1040 and a fourth testing pad 1042, the fourth testing pad 1042 couples to the third testing pad 1040.

In one embodiment, the first testing pad 1020 couples to the second testing pad 1022 by a first interconnector L1, and the third testing pad 1040 couples to the fourth testing pad 1042 by the second interconnector L2. The first testing pad 1020 couples to the electronic element matrix 100 by a third interconnector L3, and a third testing pad 1040 couples to the electronic element matrix 100 by a fourth interconnector L4. The third load 106 couples to a third end 100c (common gate) of the electronic element matrix 100 by a fifth interconnector L5. The fourth load 108 couples to a fourth end 100d (common body) of the electronic element matrix 100 by a sixth interconnector L6. The first interconnector L1, the second interconnector L2, the third interconnector L3, the fourth interconnector L4, the fifth interconnector L5 and the sixth interconnector L6 can comprise a plurality of metal conductive lines arranged in parallel. The metal conductive lines are low resistance metal conductive lines.

Figure 3:
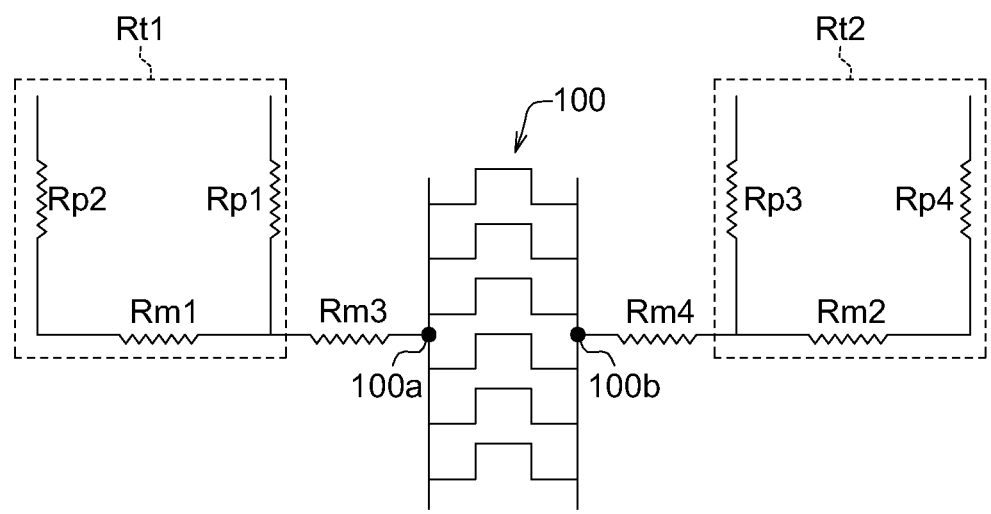
FIG. 3 illustrates a diagram showing a method for testing a layout structure of the electronic element according to an embodiment of the invention.

The method for testing the layout structure of the electronic element 10 is illustrated below by ways of embodiments of the invention. Please referring to FIG. 3, FIG. 3 illustrates a diagram showing a method for testing a layout structure of the electronic element according to one embodiment of the invention. The same elements in FIGS. 1-3 are represented with same symbols, and are not repeated herein.

Please referring to FIGS. 2-3, the first load 102 is used to contact with a first probe (not shown), and the second load 104 is used to contact with a second probe (not shown). A resistor Rp1 represents the resistor of the first testing pad 1020 and the contact resistance between the first probe and the first testing pad 1020. A resistor Rp2 represents the resistor of the second testing pad 1022 and the contact resistance between the first probe and the second testing pad 1022. A resistor Rp3 represents the resistor of the third testing pad 1040 and the contact resistance between the second probe and third testing pad 1040. A resistor Rp4 represents the resistor of the fourth testing pad 1042 and the contact resistance between the second probe and the fourth testing pad 1042.

The resistor Rm1 represents the resistor of the first interconnector L1, the resistor Rm2 represents the resistor of the second interconnector L2, the resistor Rm3 represents the resistor of the third interconnector L3, and the resistor Rm4 represents the resistor of the fourth interconnector L4. The resistances of the resistor Rm1, the resistor Rm2, the resistor Rm3 and the resistor Rm4 can be designed and evaluated according to manufacturing process specification of the electric design rule (EDR).

In one embodiment, the resistance of the first load 102 and the contact resistance between the first probe and the first load 102 can be calculated as a resistance of the first resistor Rt1. In other words, the resistance of the first resistor Rt1 can be sum of the contact resistance between the first probe and the first testing pad 1020, the contact resistance between the first probe and the second testing pad 1022, the resistance of the first testing pad 1020, the resistance of the second testing pad 1022 and the resistance of the resistor Rm1 of the first interconnector L1.

Similarly, the resistance of the second load 104 and the contact resistance between the second load 104 and second probe can be calculated as a resistance of the second resistor Rt2. In other words, the resistance of the second resistor Rt2 can be sum of the contact resistance between the second probe and the third testing pad 1040, the contact resistance between the second probe and the fourth testing pad 1042, the resistance of the third testing pad 1040, the resistance of the fourth testing pad 1042 and the resistance of the resistor Rm2 of the second interconnector L2.

Figure 4:
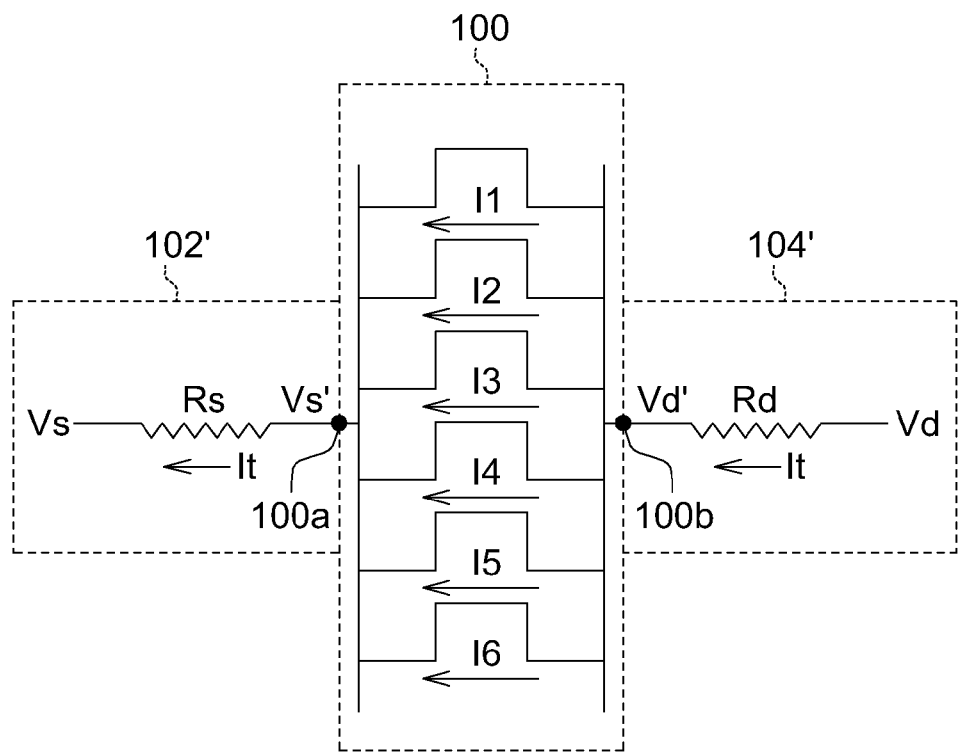
FIG. 4 illustrates a diagram showing a method for testing a layout structure of the electronic element according to an embodiment of the invention.

FIG. 4 illustrates a diagram showing the method for testing a layout structure of the electronic element according to an embodiment of the invention. As shown in FIG. 4, a voltage difference can be applied between the first load 102' and the second load 104' by testing machinery. In particular, a first external voltage Vs can be applied to the first load 102', and a second external voltage Vd can be applied to the second load 104'. In other words, the voltage difference is a voltage level difference between a first external voltage applying to the first load 102' and a second external voltage applying to the second load 104'. The first load 102' in FIG. 4 can comprise the first load 102 and the third interconnector L3 in FIG. 2, the second load 104' can comprise the second load 104 and the fourth interconnector L4 in FIG. 2. The resistance of the resistor Rs can be sum of the resistance of the first resistor Rt1 and the resistance of the resistor Rm3, and the resistor Rd can be sum of the resistance of the second resistor Rt2 and the resistance of the resistor Rm4.

In this embodiment, the electronic element matrix 100 is a MOSFET matrix. The drain current Id can be evaluated by referring to a characteristic curve of drain current Id and source voltage Vs of MOSFET $$Id = pVs' + n \quad (1)$$

The drain current Id can also be evaluated by referring to a characteristic curve of drain current Id and drain voltage Vd of MOSFET:

$$Id = qVd' + m \quad (2)$$

p, n, q and m are constant.

The current It passing through the electronic element matrix 100 can be evaluated by adding the equation (1) and the equation (2) together $$It = \alpha Vs' + \beta + \gamma Vd' \quad (3)$$

α, β and γ are constant.

Please referring to FIG. 4, according to the detected current It passing through the electronic element matrix 100, the first external voltage Vs and the first resistor Rs, the side voltage Vs' of the first side 100a where the first load 102' couples to the electronic element matrix 100 can be calculated based on Ohm's law:

$$Vs' = It \times Rs + Vs \quad (4)$$

It is a detected current passing through the electronic element matrix 100, such as a sum of the I1+I2+I3+I4+I5+I6 in FIG. 4.

According to detected current It passing through the electronic element matrix 100, the second external voltage Vd and the second resistor Rd, the side voltage Vd' of the second side 100b where the second load 104' couples to the electronic element matrix 100 can be calculated:

$$Vd' = Vd - It \times Rd \quad (5)$$

A current calibrating equation can be constructed by inputting the first side voltage Vs' in equation (4) and the second side voltage Vd' in equation (5) into equation (3). The current calibrating equation can be used to calculate a calibrated current I passing through electronic element matrix 100:

$$I = \left(\frac{x}{1 - xRs + zRd}\right) \times Vs + \left(\frac{z}{1 - xRs + zRd}\right) \times Vd + \left(\frac{y}{1 - xRs + zRd}\right) \quad (6)$$

The current passing through the electronic element matrix 100 can be represented by a sum of x times of the first external voltage Vs, z times of the second external voltage Vd and a parameter $$\left(\frac{y}{1 - xRs + zRd}\right).$$

Three pairs of external voltages are respectively applied. A first external voltage and a second external voltage are respectively applied to the first load and the second load. In other words, three pairs of the first external voltage Vs and the second external voltage Vd voltage are inputted into equation (6). According to the detected current It passing through the electronic element matrix 100, the first external voltage Vs and the second external voltage Vd, the first resistor Rs and the second resistor Rd, the values of the x, y and z can be evaluated. Then, the evaluated values of the x, y and z are inputted into the current calibrating equation (6), such that the calibrated current Ic passing through the electronic element matrix 100 can be calculated.

The three pairs of the first external voltages Vs and the second external voltages Vd can be applied respectively. For example, during the first applying step, the first voltage level (such as Vdd) is taken as the first external voltage Vs and 0 voltage level is taken as the second external voltage Vd. During the second applying step, a sum of the first voltage level (such as Vdd) and a bias voltage (such as 0.05V) is taken as the first external voltage Vs, and 0 voltage level is taken as the second external voltage Vd. During the third applying step, the first voltage level (such as Vdd) is taken as the first external voltage Vs, and a difference between the second voltage level (such as Vss) minus the bias voltage (such as 0.05) is taken as the second external voltage Vd.

By applying three pairs of external voltages with different values, a calibrated current Ic can be evaluated. The calibrated current Ic eliminates the IR Drop effect causing by the contact resistance between the testing pad and the probe and resistance of the resistor of testing pad, the calibrated current Ic is more precise and accurate than the detected current It.

Figure 5:
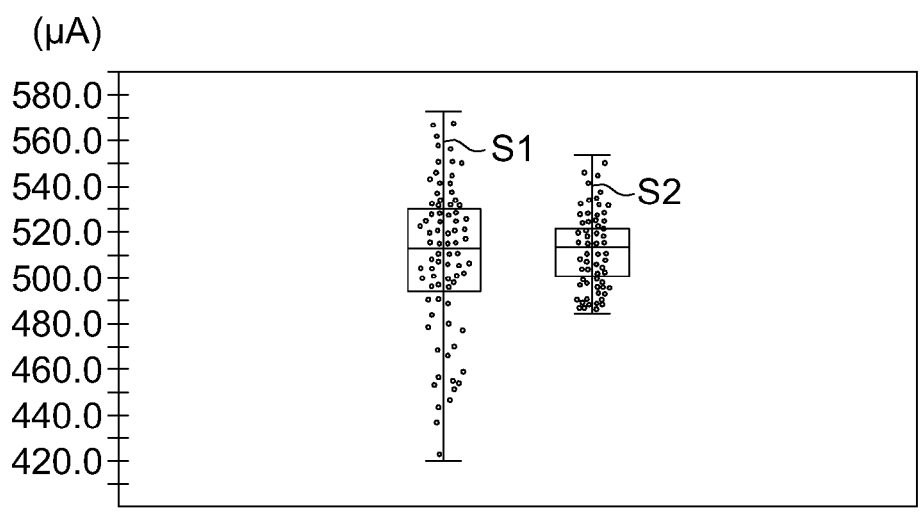
FIG. 5 illustrates a comparative diagram of statistical results of a comparative example and an embodiment according to the invention.

FIG. 5 illustrates a comparative diagram of statistical results between a comparative example and an embodiment according to the invention. The statistical result S1 represents standard deviation of row data, statistical result S2 represents standard deviation of data obtained according to the invention described above.

As shown in FIG. 5, the statistical result S1 is standard deviation calculated according to conventional wafer acceptance test, this standard deviation comprises global (within-wafer die to die) variation and local (intra-die) variation. In contrast, the statistical result S2 is standard deviation calculated according to wafer acceptance test by method described above, this standard deviation eliminates local (intra-die) variation and retain global (within-wafer die to die) variation.

The entirety of the statistical result S1 is similar to the entirety of the statistical result S2. The data in statistical result S1 is more disperse than the data in the statistical result S2, and the statistical result S1 has larger error bar than the statistical result S2. The statistical result S1 is not beneficial to selection of golden die. In other words, if a golden die is characterized by 510 μA current passing through a transistor, electronic elements (such as MOSFET) in a matrix tested by method according to the above embodiment of the invention described above have a smaller error ranging from 510 μA, so that the stability of the manufacturing process can be ensured.

Based on the above, the layout structure of the electronic element described above in embodiments of the invention and testing methods for testing the same provide loads couple to two sides of the electronic element matrix, and each load comprises two testing pads couples to each other. By calculating resistances of the loads, the current passing through the electronic element matrix can be more precise, and the improved accuracy of the wafer acceptance test can be beneficial to golden die selection.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A layout structure of the electronic element, comprising:
   an electronic element matrix;
   a first load coupling to a first side of the electronic element matrix, the first load comprising a first testing pad and a second testing pad electrically coupling to the first testing pad in serial; and
   a second load coupling to a second side of the electronic element matrix, the second load comprising a third testing pad and a fourth testing pad electrically coupling to the third testing pad in serial;
   wherein the first testing pad couples to the second testing pad by a first interconnector, and the third testing pad couples to the fourth testing pad by a second interconnector.

2. The layout structure of the electronic element according to claim 1, wherein the electronic element matrix comprise a plurality of transistors.

3. The layout structure of the electronic element according to claim 1, wherein the electronic element matrix is a MOSFET matrix.

4. The layout structure of the electronic element according to claim 3, wherein the first side is a source of each of the transistors, the second side is a drain of each of the transistors, and the transistors are arranged in common source, common drain and common gate.

5. The layout structure of the electronic element according to claim 1, wherein the first testing pad couples to the electronic element matrix by a third interconnector, and the third testing pad couples to the electronic element matrix by a fourth interconnector.

6. The layout structure of the electronic element according to claim 5, wherein the first interconnector, the second interconnector, the third interconnector and the fourth interconnector are metal conductive lines.

7. The layout structure of the electronic element according to claim 5, wherein the first interconnector, the second interconnector, the third interconnector and the fourth interconnector respectively comprise a plurality of metal conductive lines arranged in parallel.

8. The layout structure of the electronic element according to claim 1, wherein the first load is used for contacting with a first probe, and wherein a resistance of the first load and a contact resistance between the first probe and the first load is a resistance of a first resistor.

9. The layout structure of the electronic element according to claim 8, wherein the resistance of the first resistor is a sum of a contact resistance between the first probe and the first testing pad, a contact resistance between the first probe and the second testing pad, a resistance of the first testing pad, a resistance of the second testing pad and a resistance of the first interconnector.

10. The layout structure of the electronic element according to claim 1, wherein the second load is used for contacting with a second probe, and wherein the resistance of the second load and a contact resistance between the second probe and the second load is a resistance of a second resistor.

11. The layout structure of the electronic element according to claim 10, wherein the resistance of the second resistor is a sum of a contact resistance between the second probe and the third testing pad, a contact resistance between the second probe and the fourth testing pad, a resistance of the third testing pad, a resistance of the fourth testing pad and a resistance of the second interconnector.

12. A method for testing an electronic element, comprising:
   providing a layout structure of an electronic element, comprising an electronic element matrix, a first load coupling to a first side of the electronic element matrix and a second load coupling to a second side of the electronic element matrix, the first load comprising a first testing pad and a second testing pad electrically coupling to the first testing pad in serial, the second load comprising a third testing pad and a fourth testing pad electrically coupling to the third testing pad in serial;
   disposing a first probe on the first load and disposing a second probe on the second load;
   calculating a resistance of a first resistor and a resistance of a second resistor, the first resistor is related to a resistor of the first load and a contact resistance between the first probe and the first load, the second resistor is related to a resistor of the second load and a contact resistance between the second probe and the second load;
   applying a voltage difference between the first load and the second load;
   detecting a detected current passing through the electronic element matrix; and
   calculating a calibrated current passing through the electronic element matrix, according to the detected current, the voltage difference, the first resistor and the second resistor.

13. The method according to claim 12, wherein the voltage difference is a voltage level difference between a first external voltage applying to the first load and a second external voltage applying to the second load, and the step of calculating the calibrated current passing through the electronic element matrix comprises:
   obtaining a first side voltage at the first side of the electronic element matrix according to the detected current, the first external voltage and the first resistor;
   obtaining a second side voltage at the second side of the electronic element matrix according to the detected current, the second external voltage and the second resistor; and
   calculating the calibrated current passing through the electronic element matrix according to the first side voltage and the second side voltage.

14. The method according to claim 12, wherein the step of providing the layout structure of the electronic element comprises:
   providing a first interconnector to couple the first testing pad and the second testing pad, and providing a second interconnector to couple the third testing pad and the fourth testing pad.

15. The method according to claim 12, wherein the step of calculating the resistance of the first resistor comprises:
   calculating a sum of a contact resistance between the first probe and the first testing pad, a contact resistance between the first probe and the second testing pad, the resistance of the first testing pad, the resistance of the second testing pad and the resistance of the first interconnector as the resistance of the first resistor; and
   the step of calculating the resistance of the second resistor comprises:
   calculating a sum of a contact resistance between the second probe and the third testing pad, a contact resistance between the second probe and the fourth testing pad, the resistance of the third testing pad, the resistance of the fourth testing pad and the resistance of the second interconnector as the resistance of the second resistor.

16. The method according to claim 12, wherein the voltage difference is a voltage level difference between a first external voltage applying to the first load and a second external voltage applying to the second load, and the step of calculating the calibrated current passing through the electronic element matrix comprises:
   constructing a current calibrating equation according to Ohm's law and a transistor characteristic curve, wherein current passing through the electronic element matrix represented by a sum of x times of the first external voltage, z times of the second external voltage and a parameter y;
   obtaining the values of x, y and z according to the detected current, the first external voltage and the second external voltage; and
   inputting the values of obtained x, y and z into the current calibrating equation, to calculate the calibrating current passing through the electronic element matrix.

17. The method according to claim 16, wherein the transistor characteristic curve comprises a curve of source voltage versus drain current, and another curve of drain voltage versus drain current.

18. The method according to claim 12, wherein the voltage difference is a voltage level difference between a first external voltage applying to the first load and a second external voltage applying to the second load, and the step of applying the voltage difference comprises:
   applying a first voltage level as the first external voltage, and applying 0V voltage level as the second external voltage during a first applying step;
   applying a sum of the first voltage level and a bias voltage as the first external voltage, and applying 0V voltage level as the second external voltage during a second applying step; and
   applying the first voltage level as the first external voltage, applying a difference between a second voltage level and the bias voltage as the second external voltage during a third applying step.

\* \* \* \* \*